United States Patent
Kumar et al.

(10) Patent No.: US 7,496,819 B2
(45) Date of Patent: Feb. 24, 2009

(54) CUSTOM LOGIC BIST FOR MEMORY CONTROLLER

(75) Inventors: Sathish Kumar, Bangalore (IN); Lakshmanan Ramakrishnan, Bangalore (IN); Lionel D'Luna, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 642 days.

(21) Appl. No.: 10/871,235

(22) Filed: Jun. 18, 2004

(65) Prior Publication Data

US 2005/0188255 A1    Aug. 25, 2005

Related U.S. Application Data

(60) Provisional application No. 60/542,595, filed on Feb. 5, 2004.

(51) Int. Cl.
*G01R 31/28* (2006.01)
*G06F 11/00* (2006.01)

(52) U.S. Cl. .................. 714/734; 714/738; 714/742

(58) Field of Classification Search .......... 714/734, 714/742, 738
See application file for complete search history.

(56) References Cited

U.S. PATENT DOCUMENTS

| | | | | |
|---|---|---|---|---|
| 4,339,819 A | * | 7/1982 | Jacobson | 714/734 |
| 5,657,443 A | * | 8/1997 | Krech, Jr. | 714/42 |
| 6,397,357 B1 | * | 5/2002 | Cooper | 714/703 |
| 6,802,023 B2 | * | 10/2004 | Oldfield et al. | 714/7 |
| 7,305,595 B2 | * | 12/2007 | Goodwin et al. | 714/718 |
| 2002/0145441 A1 | * | 10/2002 | Shiraishi | 324/765 |
| 2003/0237033 A1 | * | 12/2003 | Borri et al. | 714/718 |
| 2005/0060604 A1 | * | 3/2005 | Goodwin et al. | 714/7 |

FOREIGN PATENT DOCUMENTS

| | | | |
|---|---|---|---|
| EP | 400876 A2 | * | 12/1990 |
| EP | 652568 A1 | * | 5/1995 |
| JP | 2002311090 A | * | 10/2002 |

* cited by examiner

*Primary Examiner*—Cynthia Britt
(74) *Attorney, Agent, or Firm*—McAndrews Held & Malloy Ltd.

(57) ABSTRACT

A method and system for testing a memory controller are provided herein. A test sequence may be generated within the memory controller. A test output may also be generated within the memory controller, where the test output is associated with the test sequence. The test output may then be verified. The test sequence may comprise one or more of a control command, a memory address, and/or a DQM signal. The test output may be generated by a sequencer. The test output may be verified by a cyclic redundancy check (CRC) module. The test sequence may also comprise random write data. The random write data may be communicated to a memory controller write data output via a write data bus.

16 Claims, 6 Drawing Sheets

CUSTOM LOGIC BIST FOR MEMORY CONTROLLER

CROSS-REFERENCE TO RELATED APPLICATIONS/INCORPORATION BY REFERENCE

This application claims priority to U.S. Provisional Application for Patent, Ser. No. 60/542,595, "CUSTOM LOGIC BIST FOR MEMORY CONTROLLER", filed Feb. 5, 2004, by Kumar, which is incorporated herein by reference in its entirety for all purposes.

BACKGROUND OF THE INVENTION

To verify a Double Data Rate (DDR) interface, numerous out-of-chip screenings may be required to ensure compliance with manufacturer's specifications. Such out-of-chip screenings may be performed by automatic test equipment (ATE), for example. An ATE may apply functional test patterns to the chip containing the DDR interface. The result from applying a test pattern may be collected at the DDR interface output. Another set of patterns may be applied back by the ATE, whose end result may be collected at some other interface. A test pattern may be selected so that if the DDR interface functions properly and is compliant with specifications, a known result may be expected after the ATE verification process is complete.

However, problems with out-of-chip screenings may arise especially at higher operating frequencies, for example if a DDR interface is operating at 200 MHz (i.e., the data rate is at 400 MHz). A vector slip may occur, which does not allow for a proper screening. For example, a sequence of test vectors may be applied to the DDR interface at a time $t_n$ and a specific pattern output, or output vector, may be expected at the DDR interface output at a later time $t_{n+m}$. However, because of process variation within the DDR interface, a vector slip may occur and the expected output vector may be generated at the DDR interface output at a time $t_{n+m+2}$, i.e., two clock cycles later than expected. In addition, during out-of-chip screening, the DDR interface does not utilize the on-chip PLL clock for the screening process since an out-of-chip process is applied and there is no synchronization between the internal DDR interface PLL clock and the external clock related to the generated out-of-chip testing vectors. An out-of-chip clock, therefore, has to be utilized to accomplish proper DDR interface screening. An out-of-chip clock, however, may not account for process variations (e.g., jitters) within the DDR interface.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for testing a memory controller. In an embodiment of the present invention, a test sequence may be generated within the memory controller. A test output may also be generated within the memory controller, where the test output is associated with the test sequence. The test output may then be verified. The test sequence may comprise one or more of a control command, a memory address, and/or a DQM signal. The test output may be generated by a sequencer. The test output may be verified by a cyclic redundancy check (CRC) module. The test sequence may also comprise random write data. The random write data may be communicated to a memory controller write data output via a write data bus. The random write data may be sampled from the read data bus and may be verified for its correctness. The test sequence may also comprise random read data. The random read data may be communicated to a sequencer via a read data bus, and a test output may be generated by the sequencer, where the sequencer may utilize the random read data.

Certain aspects of the system for testing a memory controller may comprise a signal generator for generating a test sequence within the memory controller, a memory logic circuit for generating a test output, where the test output may be associated with the test sequence, and a testing circuit for verifying the test output. The test sequence may comprise one or more of a control command, a memory address and/or a DQM signal. The memory logic circuit may comprise a sequencer. The testing circuit may comprise a cyclic redundancy check (CRC) module. The test sequence may also comprise random write data. A write data bus may be provided for communicating the random write data to a memory controller write data output, and a read data bus may be communicatively coupled to the write data bus and the testing circuit. A cyclic redundancy check (CRC) module may be provided for verifying the random write data sampled from the read data bus. The test sequence may also comprise random read data. A read data bus may be provided for communicating the random read data to the memory logic circuit.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for testing a memory controller. In one embodiment of the present invention, the memory controller may generate a test sequence and a subsequent test output, associated with the test sequence, where the test output may be verified. The test sequence may comprise a control command, a memory address, and/or a DQM signal. The test output may be generated by a sequencer and may then be verified by a cyclic redundancy check (CRC) module. The test sequence may also comprise random write data, which may be communicated to a memory controller write data output via a write data bus. In addition, the random write data may be communicated to a read data bus. The random write data from the read data bus may then be verified. If the test sequence comprises random read data, the test sequence may be communicated to a sequencer via a read data bus. A test output may be generated by the sequencer, where the sequencer may utilize the random read data.

Figure 1:
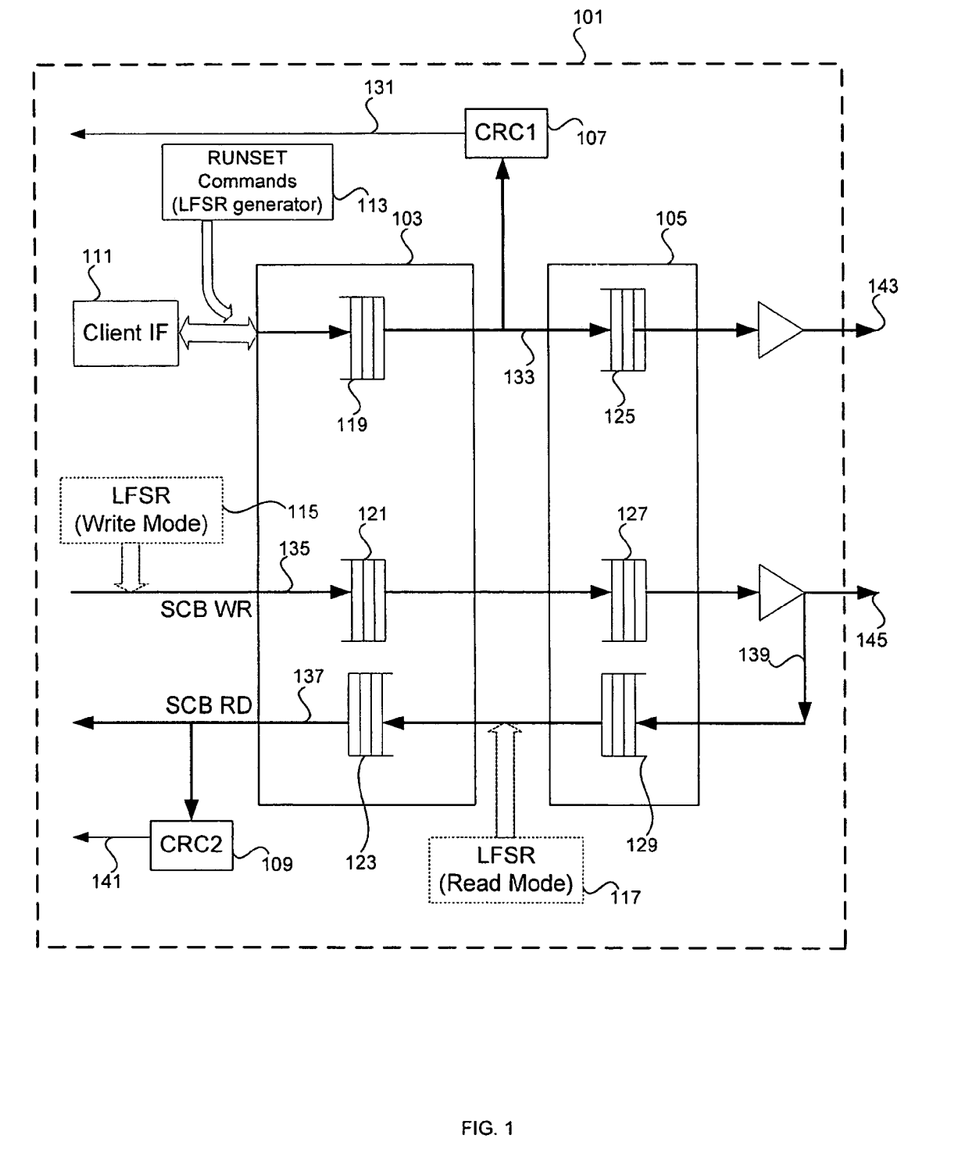
FIG. 1 is a graphical diagram of an exemplary DDR memory controller with custom logic built-in self test (BIST), in accordance with an embodiment of the present invention.

FIG. 1 is a graphical diagram of an exemplary DDR memory controller with custom logic built-in self test (BIST), in accordance with an embodiment of the present invention. Referring to FIG. 1, the DDR memory controller 101 may comprise a sequencer 103, an Input/Output buffer (IOBUF) 105, a client interface 111, cyclic redundancy check (CRC) circuits 107 and 109, a RUNSET-command generator 113, a command bus 133, a system control bus for a write signal (SCB WR) 135, a system control bus for a read signal (SCB RD) 137, and linear feedback shift registers (LFSR) 115 and 117. The sequencer 103 may comprise first-in-first-out (FIFO) registers 119, 121, and 123. The IOBUF 105 may comprise FIFO registers 125, 127, and 129.

The sequencer 103 inside the DDR memory controller 101 may also comprise logic circuitry adapted to generate additional commands, reference signals, and interfaces with memory clients, for example. The IOBUF 105 may comprise circuitry that incorporates specific timing protocols that may be required by the DDR memory controller 101. In addition, the IOBUF 105 may manipulate DQS strobe signals relating to read and write data, so that the DQS strobe signals are properly phase-positioned relative to the corresponding data. For example, a DQS strobe signal may be center-aligned (90-degrees phase shifted) with the write data and edge-aligned (O-degrees phase shift) with respect to the read data. In order for the DDR memory controller to properly sample a read data signal, the IOBUF may be adapted to phase-shift the DQS strobe signal by 90-degrees so that it is center-aligned with respect to the read data signal. A delay line may be utilized, for example, in the IOBUF 105 in order to achieve the 90-degree phase shifting.

A CRC logic may be utilized in connection with embodiments of the present invention in order to generate a pass/fail signal and thus validate a tested signal that may be run through the CRC logic. For example, if a DDR memory controller functions properly, a certain signature may be generated by a CRC module (e.g., a pass signal). If there is a defect with the DDR memory controller, a different signature may be generated (e.g., a fail signal) and a defect may be recognized. For a given testing sequence, the CRC result is know ahead of time by a test simulation. The CRC may then generate a pass/fail signal depending on whether the proper result is achieved by the testing sequence in the simulation.

In operation, the DDR memory controller 101 may verify different types of signals along the command bus 133, the SCB WR bus 135 and the SCB RD bus 137, and thus ascertain proper functionality of the DDR memory controller circuitry. In one embodiment of the present invention, a RUNSET command generator 113 may be utilized to generate all possible write and read system control bus commands that the DDR controller 101 may accept from memory clients via the client interface 111. The RUNSET command generator 113 may also generate additional command signals, such as address signals (ADDR) and a data mask (DQM) signals. The ADDR signal may be associated with a memory address where data needs to be saved, for example. The DQM signal may be associated with an active and an inactive state, so that the DDR memory controller 101 ignores data when the DQM signal is active, and vice versa.

The commands generated by the RUNSET command generator 113, including any ADDR and DQM signals, may then be injected onto the command bus 133 between the client interface 111 and the sequencer 103. The generated commands may then be communicated through the FIFO register 119 at the sequencer 103 and through the FIFO register 125 at the IOBUF 105 to the output pad 143. However, prior to entering the IOBUF 105, the generated commands along the command bus 133 may be communicated to a first cyclic redundancy check module (CRC1) 107. The CRC could alternatively exist at the pad's return path so that the Addr/Cntrl pads are also tested. The CRC1 107 may then validate the generated commands and may generate a cyclic redundancy check output 131. The cyclic redundancy check output 131 may indicate whether the generated commands are valid, and, therefore, whether the DDR memory controller 101 functions according to specifications.

In yet a different embodiment of the present invention, an LFSR may be utilized in order to validate a write signal along the write system control bus 135. The LFSR 115 may be adapted to generate random write data signals, which may then be injected on the SCB WR 135. The SCB WR 135 may also be adapted to carry write data signals (data signals to be written into outside memory), as well as DQS strobe signals. The DQS strobe signals may be supplied by the DDR memory controller 101 when data is being written into memory, and the DQS strobe signals may be supplied by the outside memory when data is being read by the DDR memory controller 101. The DQS signal is used as a clock to sample the data. DQ is the data.

The generated random signals may then be communicated through the FIFO register 121 at the sequencer 103 and through the FIFO register 127 at the IOBUF 105 to the pad 145. In order to avoid validating the generated random write signals out-of-chip, the SCB WR 135 may be connected to the SCB RD 137 via the bus connection 139. In this way, the generated random write signals may be communicated back through the FIFO register 129 at the IOBUF 105 and though the FIFO register 123 at the sequencer 103 to a second cyclic redundancy check module (CRC2) 109. The CRC2 109 may then validate the generated random write signals and may generate a cyclic redundancy check output 141. The cyclic redundancy check output 141 may indicate whether the generated random write signals are valid, and, therefore, whether the DDR memory controller 101 functions according to specifications. By utilizing the SCB RD 137 to perform a cyclic redundancy check on the generated random write signals, the DDR memory controller 101 validates the SCB WR 135 for a generated signal up to the point of output from the DDR controller at the pad 145, as well as the SCB RD 137 for a signal that may be read from an outside memory and that may enter the DDR memory controller 101 via the pad 145.

In a different embodiment of the present invention, an LFSR may be utilized in order to validate a read signal along the read system control bus 137. The LFSR 117 may be adapted to generate random read data signals, which may then be injected on the SCB RD 137 at the input of the sequencer 103. The generated random read signals may then be communicated through the FIFO register 123 at the sequencer 103 to a second cyclic redundancy check module (CRC2) 109. The CRC2 109 may then validate the generated random read signals and may generate a cyclic redundancy check output 141. The cyclic redundancy check output 141 may indicate whether the generated random read signals are valid, and, therefore, whether the DDR memory controller 101 functions according to specifications.

Figure 2:
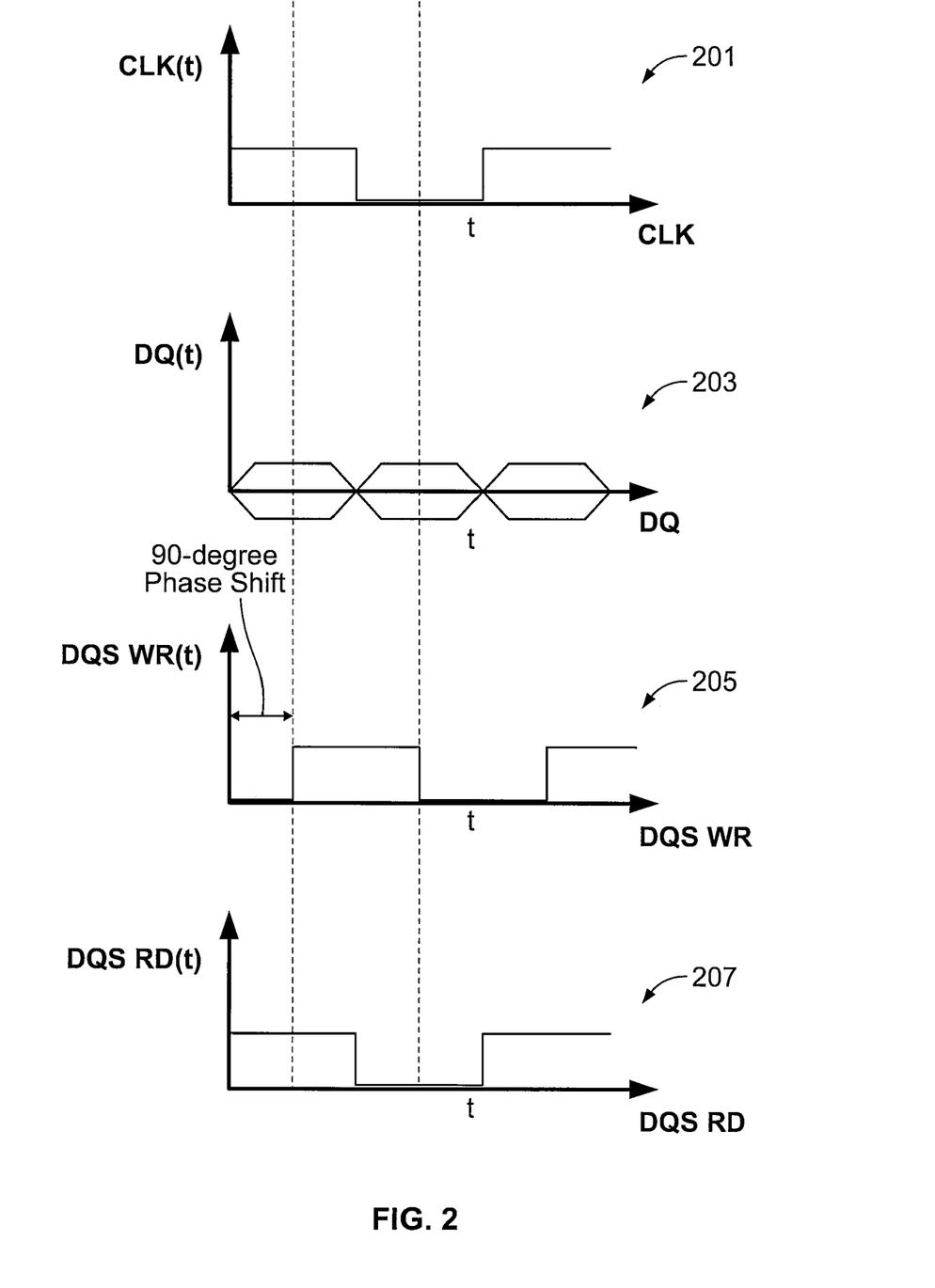
FIG. 2 is a graphical diagram illustrating alignment of DQS and DQ (data) signals that may be utilized in connection with the DDR memory controller of FIG. 1, in accordance with an embodiment of the present invention.

FIG. 2 is a graphical diagram illustrating alignment of DQS and DQ (data) signals that may be utilized in connection with the DDR memory controller of FIG. 1, in accordance with an embodiment of the present invention. For a DDR memory controller with a clock cycle as illustrated on graph 201, data (DQ) may change every 180 degrees, i.e. every half clock cycle, as illustrated on graph 203. Read and write data on the DDR memory controller may be associated with a DQS strobe signal. A DQS strobe signal may be phase-shifted with respect to a read or write signal.

For example, during a DDR write operation, data may be inputted into memory from a DDR write bus at both edges of the clock and the DDR memory captures that data. During the write operation, the DQS write signal is center-aligned, as illustrated on graph 205, and the DDR captures data at the rising edges of the DQS strobe signal. During a read operation, the DQS read signal is edge-aligned with respect to the data, as illustrated on graph 207. During a read operation, therefore, in order to achieve proper data sampling, a DDR memory controller may phase-shift the DQS read signal by 90-degrees so that it is center-aligned with respect to the data (e.g., the data DQ on graph 203 may be center aligned with the DQS RD signal of graph 207 if the DQS RD signal is 90-degrees phase-shifted). The DQS RD signal may be phase-shifted inside the DDR memory controller.

Figure 3:
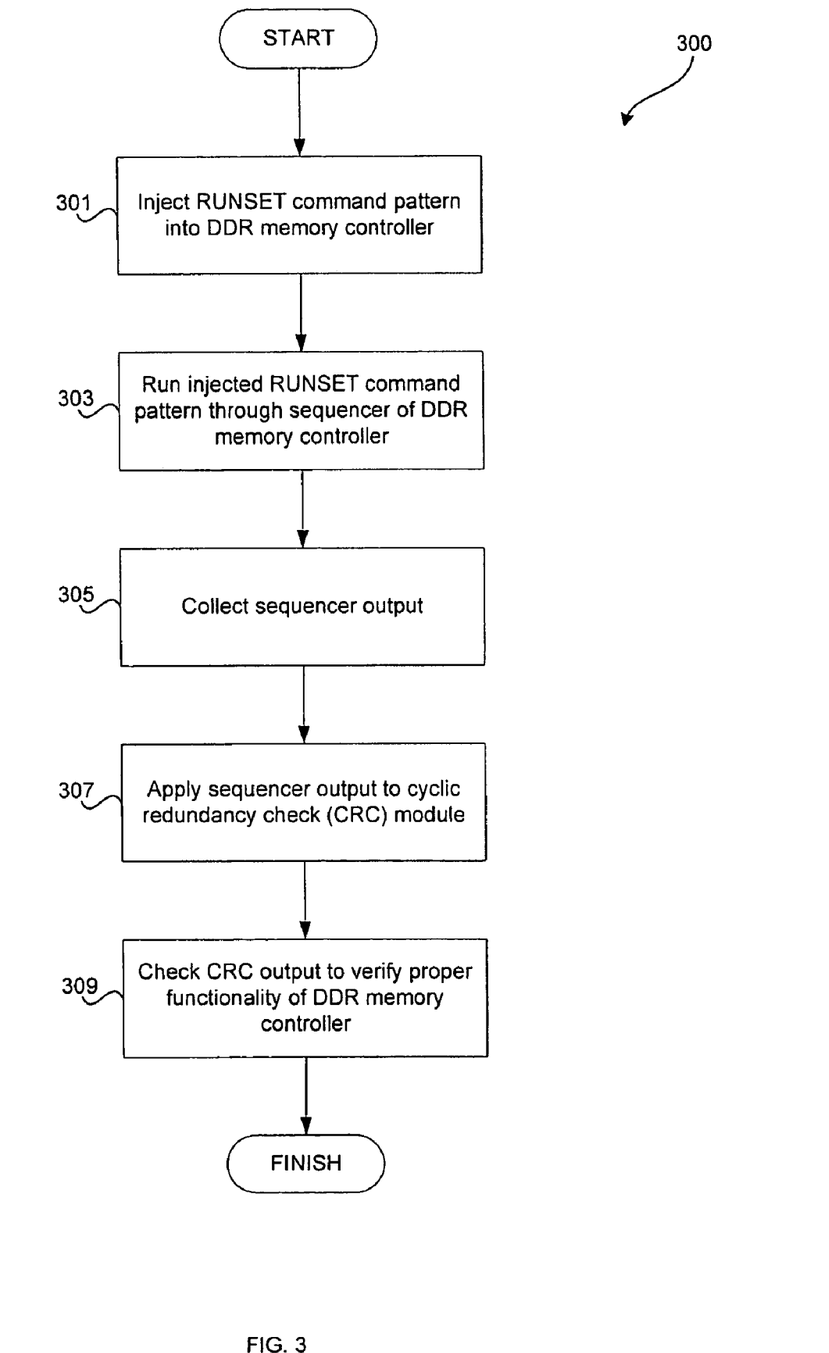
FIG. 3 is a flow diagram of a method for custom logic BIST of a RUNSET command pattern in a DDR memory controller, in accordance with an embodiment of the present invention.

FIG. 3 is a flow diagram of a method 300 for custom logic BIST of a RUNSET command pattern in a DDR memory controller, in accordance with an embodiment of the present invention. At 301, RUNSET command patterns may be injected into a DDR memory controller. At 303, the injected RUNSET command pattern may then be run through a sequencer inside the DDR memory controller. At 305, the sequencer output may be collected and, at 307, the sequencer output may be applied to a cyclic redundancy check (CRC) module. Proper functionality of the DDR memory controller may then be verified at 309 by checking the CRC output.

Figure 4:
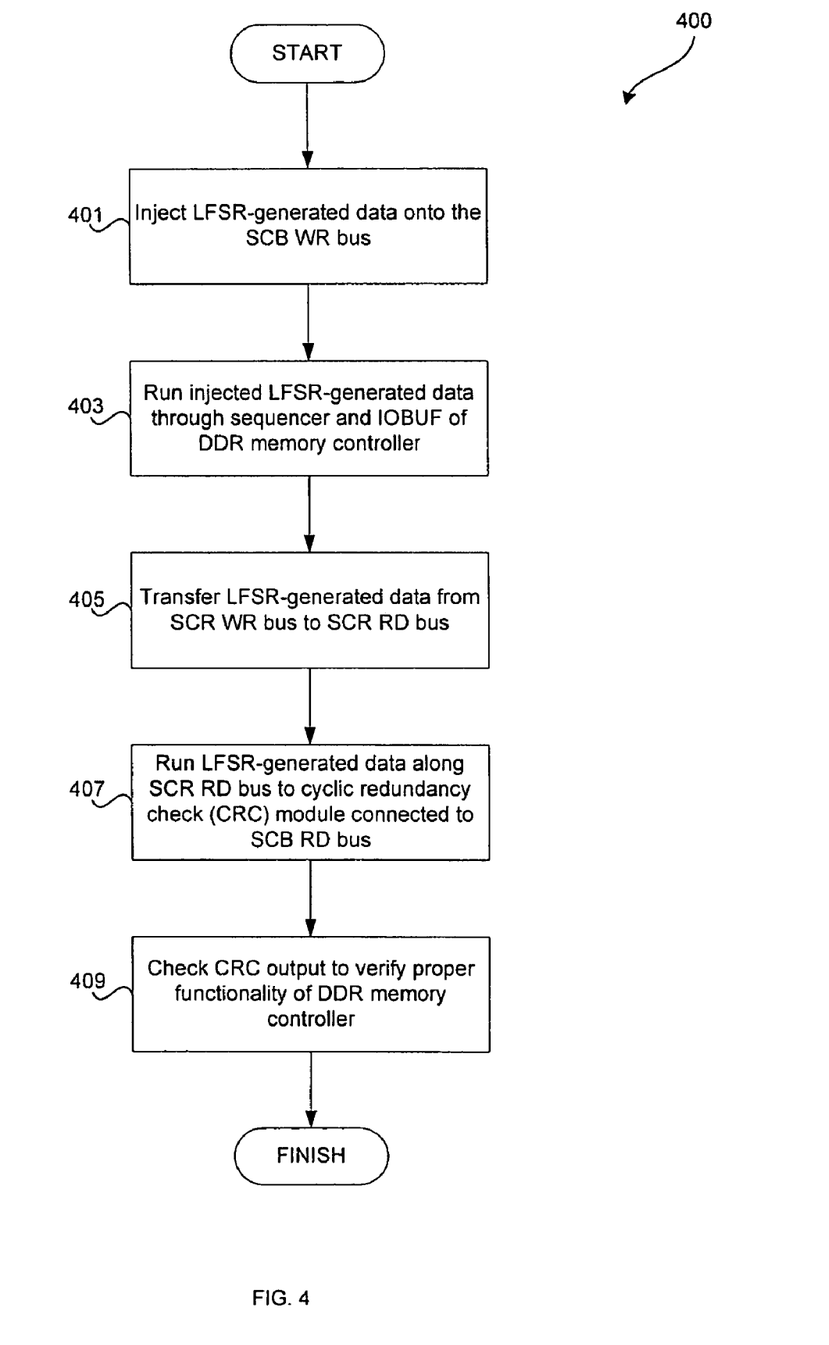
FIG. 4 is a flow diagram of a method for custom logic BIST of a write bus data in a DDR memory controller, in accordance with an embodiment of the present invention.

FIG. 4 is a flow diagram of a method 400 for custom logic BIST of a write bus data in a DDR memory controller, in accordance with an embodiment of the present invention. At 401, random data generated by a linear feedback shift register (LFSR) may be injected onto a write system control bus (SCB WR). At 403, the injected LFSR-generated data may be run through a sequencer and an input/output buffer (IOBUF) inside the DDR memory controller, for example. At 405, the LFSR-generated data may be transferred from the SCB WR to a read system control bus (SCB RD). At 407, the LFSR-generated data may be run along the SCB RD to a CRC module connected to the SCB RD. Proper functionality of the DDR memory controller may then be verified at 409 by checking the CRC output.

Figure 5:
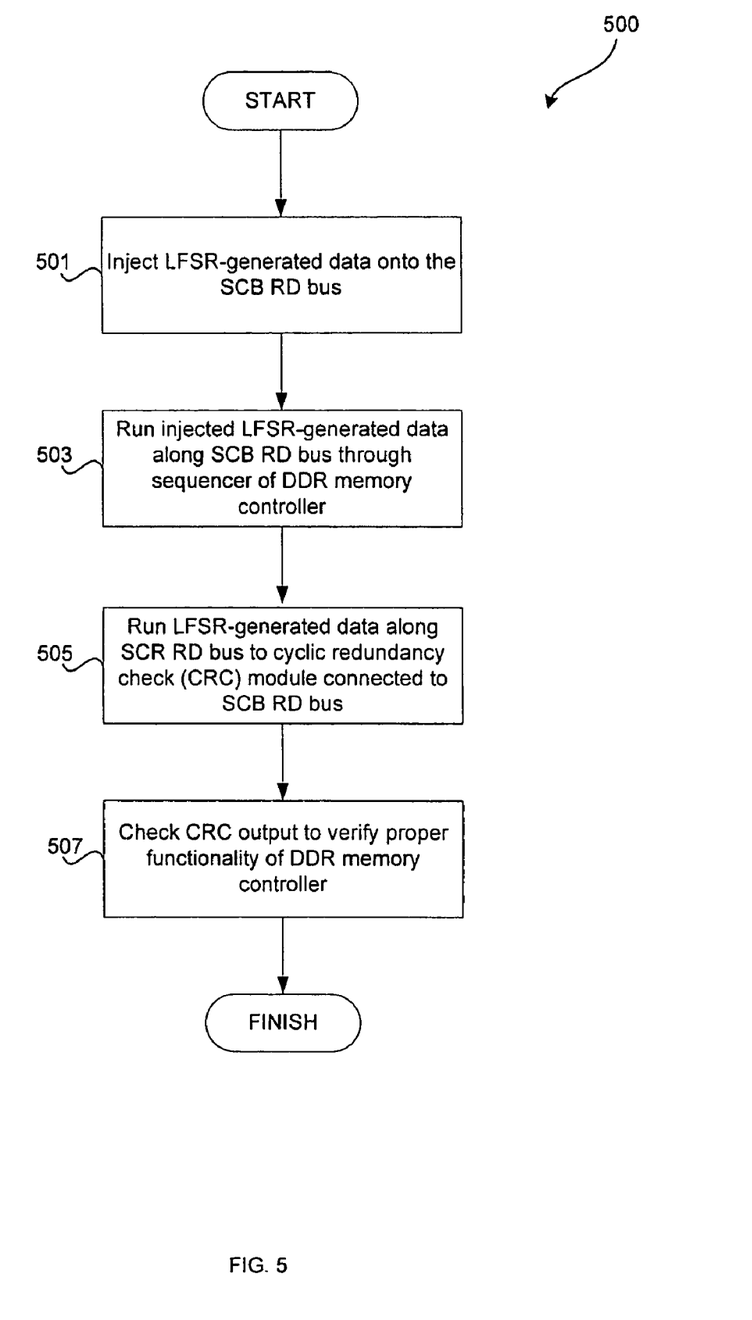
FIG. 5 is a flow diagram of a method for custom logic BIST of a read bus data in a DDR memory controller, in accordance with an embodiment of the present invention.

FIG. 5 is a flow diagram of a method 500 for custom logic BIST of a read bus data in a DDR memory controller, in accordance with an embodiment of the present invention. At 401, random data generated by a LFSR may be injected onto a read system control bus (SCB RD). At 503, the injected LFSR-generated data may be run along the SCB RD through a sequencer inside the DDR memory controller, for example. At 505, the LFSR-generated data may be run along the SCB RD to a CRC module connected to the SCB RD. Proper functionality of the DDR memory controller may then be verified at 507 by checking the CRC output.

Figure 6:
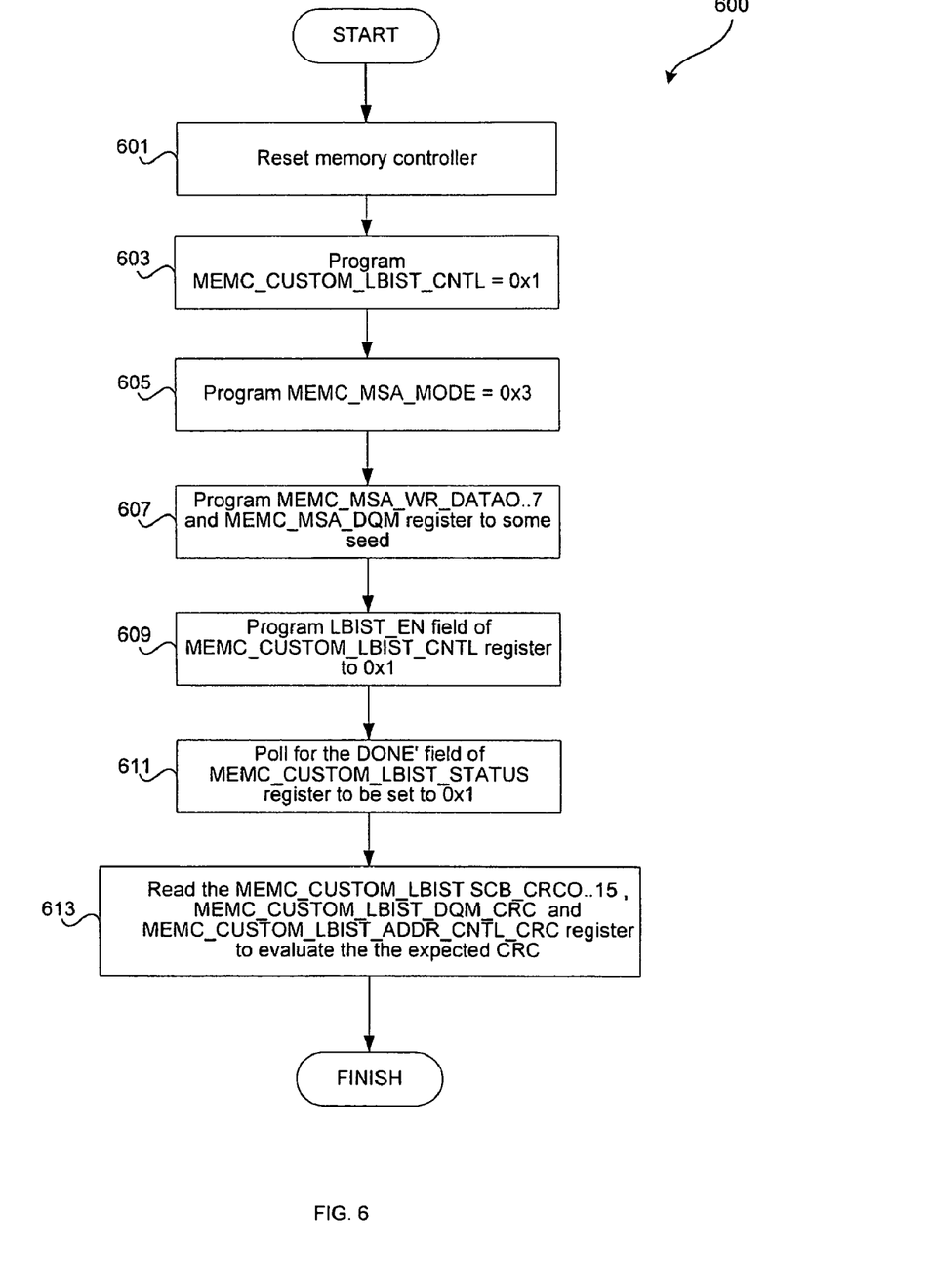
FIG. 6 is a flow diagram of a method for setting a memory controller in LBIST mode, in accordance with an embodiment of the present invention.

FIG. 6 is a flow diagram of a method 600 for setting a memory controller in LBIST mode, in accordance with an embodiment of the present invention. At 601, the DDR memory controller may be reset. During the reset operation, the sequencer may be kept in a disable mode, i.e. MEMO DDR_CNTRLR_START_SEQ=1 b0. At 603, MEMC_CUSTOM_LBIST_CNTL=0x1 may be programmed. In addition, a RUNSET field may be programmed with appropriate number. At 605, the MEMC_MSA_MODE=0x3 may be programmed (i.e., the msa client in may be placed in LFSR generation mode for SCB write data and byte mask). At 607, the MEMC_MSA_WR_DATA0. . . 7 and the MEMC_MSA_DQM register may be programmed to a predetermined seed. At 609, the LBIST_EN field of the MEMC_CUSTOM_LBIST_CNTL register may be programmed to 0x1, while retaining the remaining field values. At 611, the "DONE" field of the MEMC_CUSTOM_LBIST_STATUS register may be set to 0x1. At 613, the MEMC_CUSTOM_LBIST SCB_CRC0. . . 15, the MEMC_CUSTOM_LBIST_DQM_CRC and the MEMC_CUSTOM_LBIST_ADDR_CNTL_CRC registers may be read in order to evaluate the expected CRC.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for testing a memory controller, the method comprising:
   generating a test sequence within the memory controller;
   generating a test output within the memory controller, the test output representing an output for the test sequence; and
   verifying the test output;
   wherein the test sequence comprises at least one of a control command, a memory address, and a DQM signal.

2. The method of claim 1, wherein the test output is generated by a sequencer.

3. The method of claim 1, wherein the test output is verified by a cyclic redundancy check (CRC) module.

4. The method of claim 1, wherein the test sequence comprises random write data.

5. The method of claim 4, further comprising communicating the random write data to a memory controller write data output via a write data bus.

6. The method of claim 5, further comprising:
   communicating the random write data to a read data bus from the memory controller write data output; and
   verifying the random write data sampled from the read data bus.

7. The method of claim 1, wherein the test sequence comprises random read data.

8. The method of claim 7, further comprising:
   communicating the random read data to a sequencer via a read data bus; and
   generating a test output by the sequencer, the sequencer utilizing the random read data.

9. A system for testing a memory controller, the system comprising:
   a first circuit for generating a test sequence within the memory controller;
   a second circuit for inputting the test sequence and capturing a test output, the test output being generated responsive to the test sequence; and
   a third circuit for verifying the test output; and
   wherein the test sequence comprises at least one of a control command, a memory address and a DQM signal.

10. The system of claim 9, wherein the memory logic circuit comprises a sequencer.

11. The system of claim 9, wherein the third circuit comprises a cyclic redundancy check (CRC) module.

12. The system of claim 9, wherein the test sequence comprises random write data.

13. The system of claim 12, further comprising:
a write data bus for communicating the random write data to a memory controller write data output; and
a read data bus communicatively coupled to the write data bus and the testing circuit.

14. The system of claim 13, further comprising a cyclic redundancy check module for verifying the random write data sampled from the read data bus.

15. The system of claim 9, wherein the test sequence comprises random read data.

16. The system of claim 15, further comprising a read data bus for communicating the random read data to the memory logic circuit.

* * * * *